United States Patent
Hsu et al.

(10) Patent No.: US 7,612,581 B2
(45) Date of Patent: Nov. 3, 2009

(54) APPARATUS FOR DYNAMIC DEPLOYMENT OF PIN FUNCTIONS ON A CHIP

(75) Inventors: Wen-Chi Hsu, Changhua County (TW); Jen-Ho Kan, Hsinchu (TW); Jia-Jou Tsai, Taipei (TW)

(73) Assignee: Holtek Semiconductor Inc., Hsinchu (TW)

( * ) Notice: Subject to any disclaimer, the term of this patent is extended or adjusted under 35 U.S.C. 154(b) by 4 days.

(21) Appl. No.: 12/099,365

(22) Filed: Apr. 8, 2008

(65) Prior Publication Data
US 2009/0045837 A1    Feb. 19, 2009

(30) Foreign Application Priority Data
Aug. 16, 2007    (TW) .............................. 96130276 A

(51) Int. Cl.
G06F 7/38    (2006.01)
H03K 19/173 (2006.01)

(52) U.S. Cl. .............................. 326/37; 326/38; 326/41

(58) Field of Classification Search ............. 326/37–38, 326/41, 47
See application file for complete search history.

(56) References Cited

U.S. PATENT DOCUMENTS 5,822,610 A * 10/1998 Fung et al. ..................... 712/39
2005/0184398 A1 * 8/2005 Zhou et al. ................... 257/777

* cited by examiner

*Primary Examiner*—Anh Q Tran
(74) *Attorney, Agent, or Firm*—WPAT, PC; Justin King

(57) ABSTRACT

An apparatus for dynamic deployment of pin functions on a chip is disclosed in the present invention. The apparatus comprises: an input pin receiving unit, capable of integrating a plurality of pins and selecting pin functions according to a program; an output pin control unit, capable of issuing a control signal to the plurality of pins; and a signal control unit, controlled by the program and coupled to the input pin receiving unit and the output pin control unit so as to communicate therebetween; wherein the pin functions are designated by the user to select an output signal for each of the plurality of pins according to the program.

7 Claims, 7 Drawing Sheets

APPARATUS FOR DYNAMIC DEPLOYMENT OF PIN FUNCTIONS ON A CHIP

BACKGROUND OF THE INVENTION

1. Field of the Invention

The present invention generally relates to an apparatus for dynamic deployment of pin functions on a chip and, more particularly, to an apparatus that is useful for the user to designate the pin functions. In the present invention, the user can appoint functions to selected pins when a chip is to be re-packaged or the number of pins is to be changed. Unlike conventional methods wherein wire bonding is used to change the pin functions, the apparatus for dynamic deployment of pin functions in the present invention integrate selected pins to deploy the pins for input and the pins for output according to the user using a program.

2. Description of the Prior Art

Semiconductor processing has advanced from micro-scale to nano-scale, which multiplies the transistors on a chip. As a result, more complicated circuitry can be formed on the chip that requires more interfaces. Therefore, more and more pins are required to be manufactured in a packaging process.

On the other hand, for integrated circuit (IC) packaging, the number of pins determines the manufacturing cost to some extent. Therefore, the packaging cost could be reduced if only the pins that are used are packaged and the unused pins and/or common pins are not. Conventionally, a wire bonding process is performed to use metal wires to deploy the pins corresponding the circuitry. In this method, the pin functions are deployed without changing the chip circuitry. However, it is disadvantageous in lack of flexibility and in high cost of a bonding machine. In addition, it suffers from low yield when the bonding distance is too long. In this method, the pin functions can no longer be changed when the IC is completely packaged because the pins are fixedly bonded with the IC circuitry The present invention provides a general IC design concept emphasizing the flexibility in program design and the diversity in hardware selectivity. Therefore, the user can make the best deployment according to the practical uses and such a general IC design concept is widely applicable.

SUMMARY OF THE INVENTION

It is a primary object of the present invention to provide an apparatus for dynamic deployment of pin functions on a chip, which is useful for the user to designate the pin functions. In the present invention, the user can appoint functions to selected pins when a chip is to be re-packaged or the number of pins is to be changed. Unlike conventional methods wherein wire bonding is used to change the pin functions, the apparatus for dynamic deployment of pin functions in the present invention integrate selected pins to deploy the pins for input and the pins for output according to the user using a program.

In order to achieve the foregoing object, the present invention provides an apparatus for dynamic deployment of pin functions on a chip, the apparatus comprising:

an input pin receiving unit, capable of integrating a plurality of pins and selecting pin functions according to a program;

an output pin control unit, capable of issuing a control signal to the plurality of pins; and a signal control unit, controlled by the program and coupled to the input pin receiving unit and the output pin control unit so as to communicate therebetween;

wherein the pin functions are designated by the user to select an output signal for each of the plurality of pins according to the program.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing an apparatus for dynamic deployment of pin functions on a chip can be exemplified by the preferred embodiments as described hereinafter.

The present invention provides an apparatus for dynamic deployment of pin functions on a chip, which is useful for the user to designate the pin functions. In the present invention, the user can appoint functions to selected pins when a chip is to be re-packaged or the number of pins is to be changed. Unlike conventional methods wherein wire bonding is used to change the pin functions, the apparatus for dynamic deployment of pin functions in the present invention integrate selected pins to deploy the pins for input and the pins for output according to the user using a program. The general IC provides the user with some interfaces so that the user can configures the chip in his own way. For example, the oscillation mode of the chip can be RC oscillation or crystal oscillation, both of which are predetermined by a program or a hardware. The aforementioned techniques have been well known and therefore the descriptions thereof are not omitted.

Figure 1:
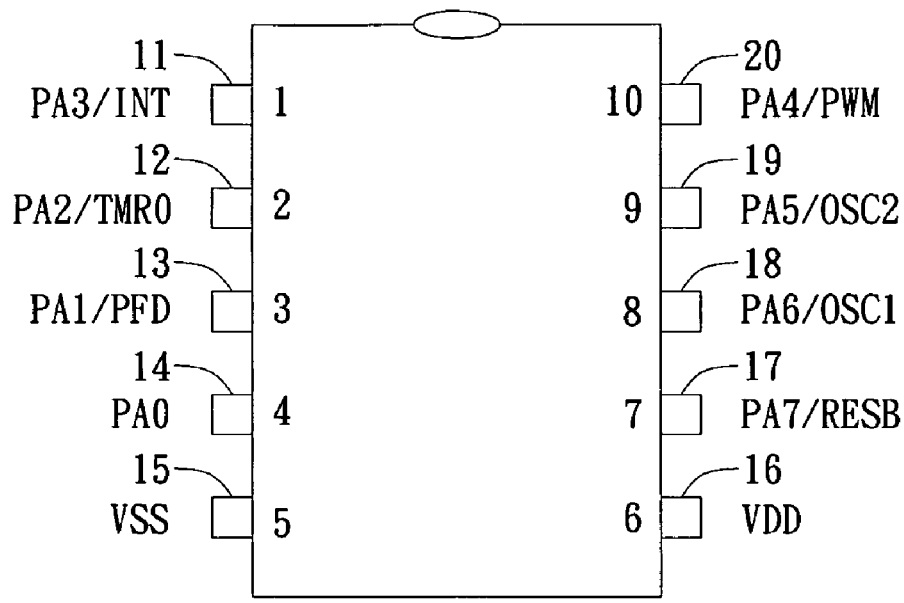
FIG. 1 is a schematic diagram of a packaged IC with a plurality of pins.
Figure 2:
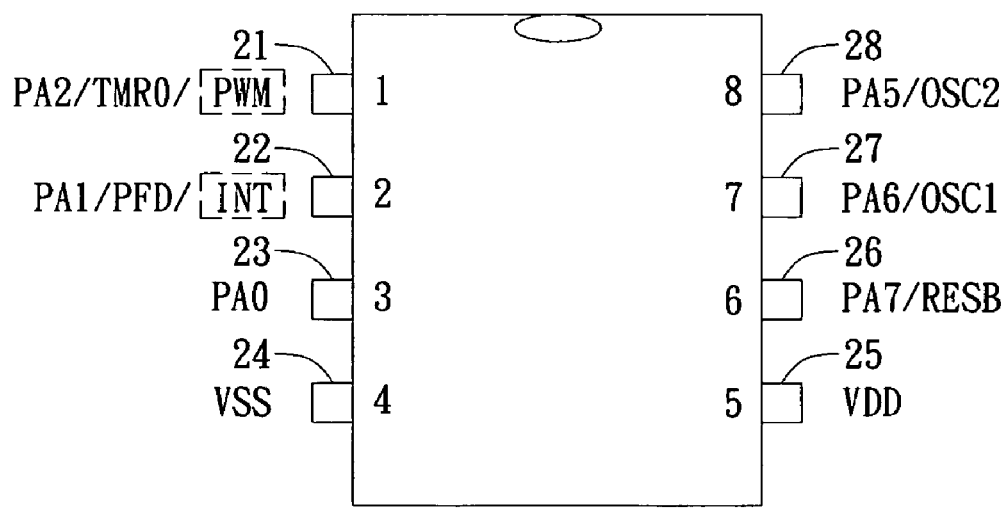
FIG. 2 is a schematic diagram of a packaged IC with reduced pins.

Please refer to FIG. 1 and FIG. 2, which show a schematic diagram of a packaged IC with a plurality of pins and a schematic diagram of a packaged IC with reduced pins, respectively. In FIG. 1, the IC (or chip) is packaged with 10 pins, each with different functions. The 10 pins are an old first pin 11, an old second pin 12, an old third pin 13, an old fourth pin 14, an old fifth pin 15, an old sixth pin 16, an old seventh pin 17, an old eighth pin 18, an old ninth pin 19 and an old tenth pin 20.

In FIG. 2, the IC is packaged with 8 pins, which is reduced from the IC of FIG. 1. Compared with the IC of FIG. 1, the old first pin 11 and the old tenth pin 20 are removed, and the functions of the old first pin 11 and the old tenth pin 20 are provided on new pins on the IC of FIG. 2. The 8 pins in FIG. 2 are a new first pin 21, a new second pin 22, a new third pin 23, a new fourth pin 24, a new fifth pin 25, a new sixth pin 26, a new seventh pin 27 and a new eighth pin 28. In FIG. 1 and FIG. 2, pins PA0 to PA7 indicate respectively I/O ports of the IC to provide functions such as an external timer (TMR0), a frequency divider (PFD), reset (RESB), oscillations (OSC1 and OSC2), etc.

In FIG. 1, the old first pin (PA3/INT) 11 provides an input/output (I/O) function as a first function (PA3) and an external interrupt (INT) function as a second function. Therefore, the external interrupt (INT) function must be taken over by one of the other pins if the old first pin 11 is to be removed. As shown in FIG. 2, the external interrupt (INT) function is provided by the new second pin 22 while the input/output (I/O) function can be replaced or removed since the I/O (PA3) function is not required. Similarly, the old tenth pin (PA4/PWM) 20 provides an input/output (I/O) function (PA4) and a pulse-width modulation (PWM) function. Therefore, the pulse-width modulation (PWM) function must be taken over by one of the other pins if the old tenth pin 20 is to be removed. As shown in FIG. 2, the pulse-width modulation (PWM) function is provided by the new first pin 21 of FIG. 1. The aforementioned deployment of pin functions is not limited to the use of plugged-in lead structure. The use of surface-mounted (SMD) pad structure is also within the scope of the present invention. Furthermore, in FIG. 1 and FIG. 2, the external interrupt (INT) function and the pulse-width modulation (PWM) function are taken over by the other pin(s). However, the input/output (I/O) function can also be taken over by the other pin according to practical use.

FIG. 2 is an example of dynamic deployment of pin functions on a chip (or IC), wherein input pin signals for the same function are pre-deployed and input into the chip. Therefore, there are many candidates for the input pins for the user to choose from according to the practical use. In this manner, malfunction will not happen due to the change in packaging. In FIG. 2, the interrupt (INT) function exemplifies the change in input pins, while the pulse-width modulation (PWM) function exemplifies the change in output pins.

According to the present invention, the user can classify the required functions in an IC and integrate the pins pre-determined to be used as input pins so that the functions can be deployed to the pins. Similarly, the same method can be used to integrate the output pins. Therefore, in the present invention, two components are used to realize dynamic deployment of pin functions.

Figure 3:
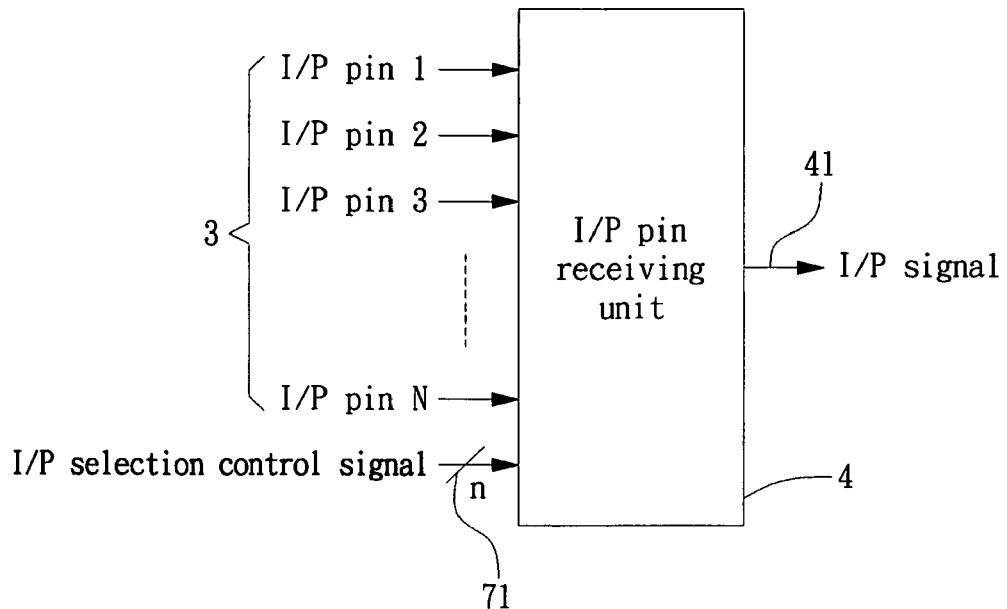
FIG. 3 is a functional block diagram of an input pin receiving unit according to the present invention.

Please refer to FIG. 3, which is a functional block diagram of an input pin receiving unit according to the present invention. In FIG. 3, all the input pins 3 (input pins from 1 to N) are integrated into an input pin receiving unit 4 to output an input signal 41. The input pins 3 for the same function are deployed to determine which pin is required by the user according to the input selection control signal 71.

Figure 4:
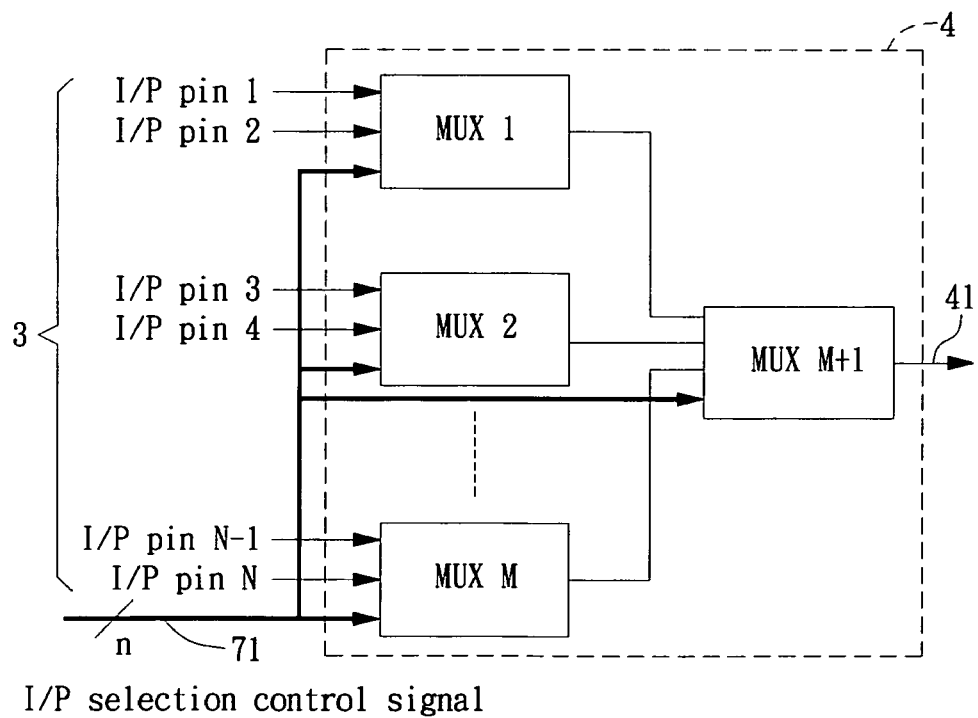
FIG. 4 is a circuit diagram of an input pin receiving unit of FIG. 3.

Please refer to FIG. 4, which is a circuit diagram of an input pin receiving unit of FIG. 3. In the present embodiment, a plurality of multiplexers (MUX) are used to deploy the input pins to the chip and the number of the multiplexers equals to half of the number of the pins plus one, i.e., MUX1 to MUX(M+1).

Figure 7:
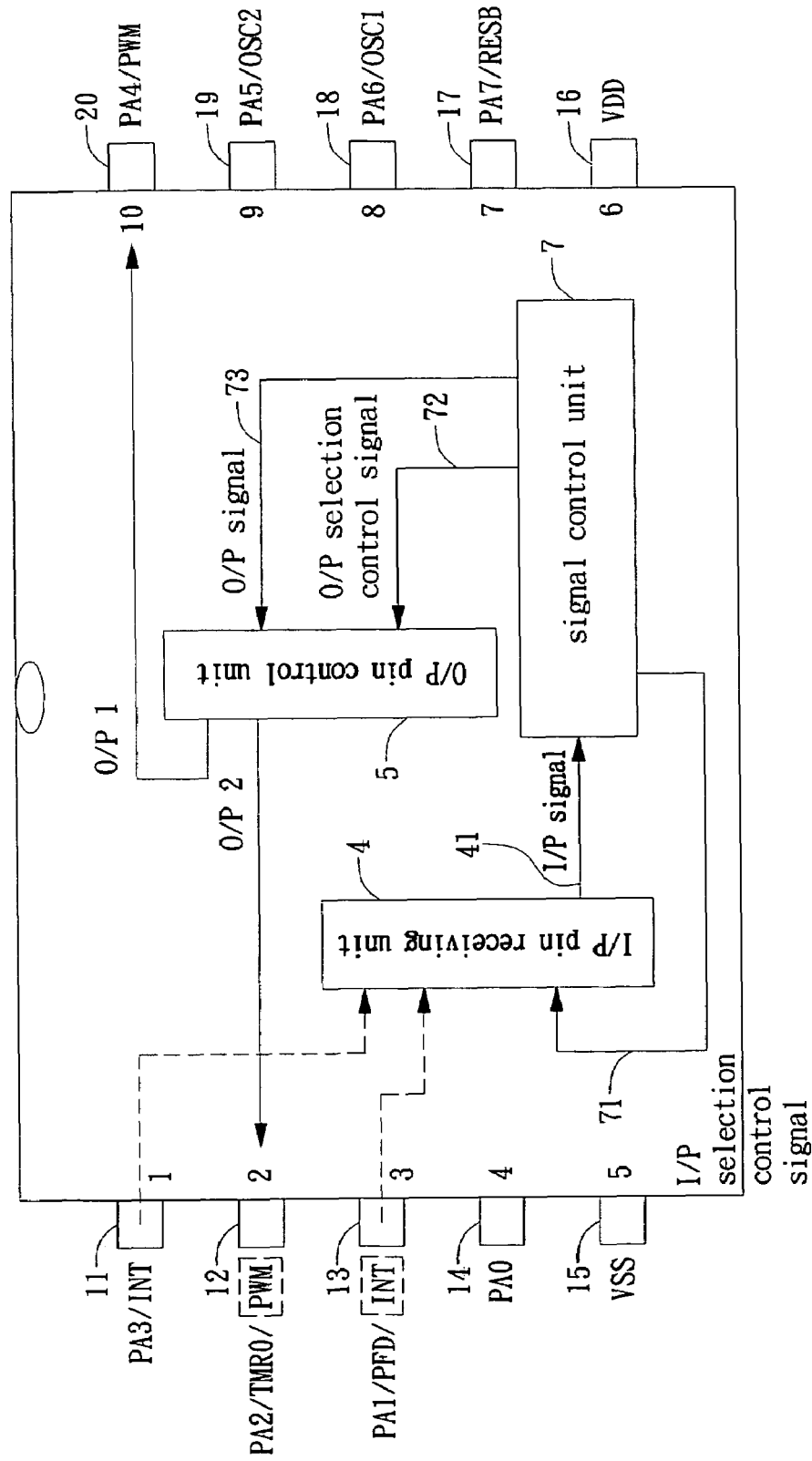
FIG. 7 shows an embodiment of an apparatus for dynamic deployment of pin functions on a chip used with an IC of FIG. 1.

Please also refer to FIG. 7, which shows an embodiment of an apparatus for dynamic deployment of pin functions on a chip used with an IC (comprising 10 pins) of FIG. 1. In FIG. 7, the input pin receiving unit 4 receives the old first pin 11 and the old third pin 13 so that the user is capable of deciding whether the old first pin 11 or the old third pin 13 to provide the interrupt (INT) function. If the IC (packaged with 8 pins) of FIG. 2 is used, the user can use the program to decide the old third pin 13 to provide the interrupt (INT) function without modifying the circuitry. The program can be software such as a software application or a firmware written in hardware.

Figure 5:
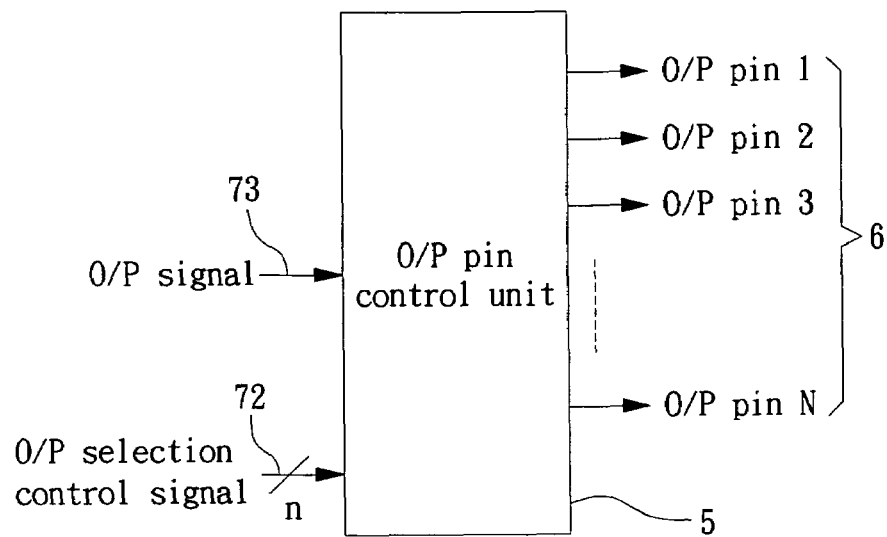
FIG. 5 is a functional block diagram of an output pin control unit according to the present invention.

Please refer to FIG. 5, which is a functional block diagram of an output pin control unit according to the present invention. In FIG. 5, the output signal 73 is output to the output pins 6 by way of the output pin control unit 5. The pre-determined output pin(s) 6 is selected by the user and the program is used to decide whether the output pin(s) 6 is to output a control signal. The user can use the output pin control unit 5 to decide which pin is required to output the control signal.

Figure 6:
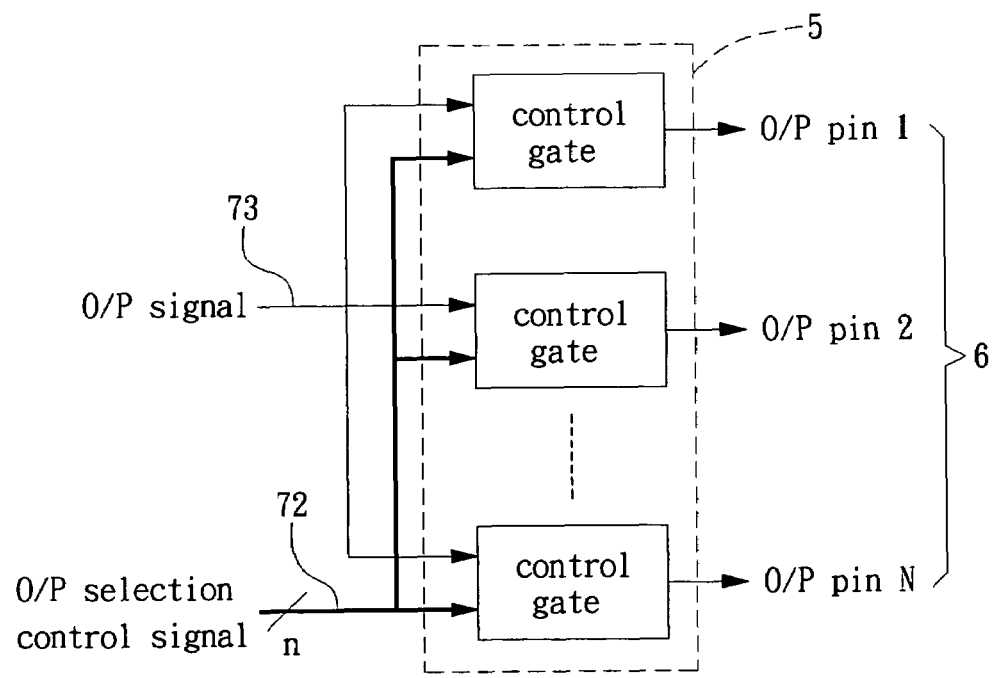
FIG. 6 is a circuit diagram of an output pin control unit of FIG. 5.

Please refer to FIG. 6, which is a circuit diagram of an output pin control unit of FIG. 5. In FIG. 6, the output pin control unit 5 comprises a plurality of control gate to be coupled to each of the output pins 6. The switching signal for each control gate is determined by the user to decide whether the control gate is to be opened or closed. In other words, by selecting a control gate, the user can decide which pin to output the output selection control signal 72.

Figure 8:
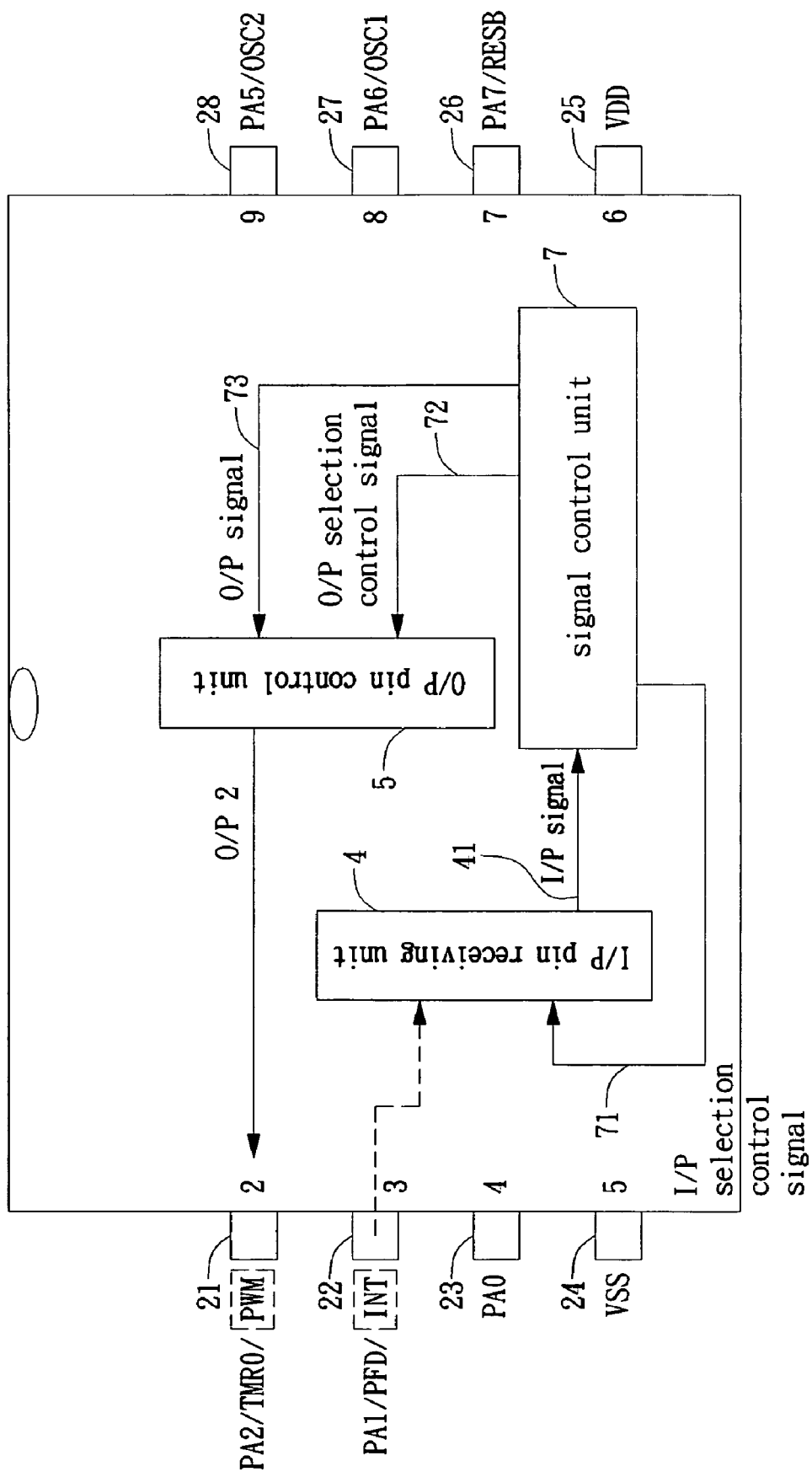
FIG. 8 shows an embodiment of an apparatus for dynamic deployment of pin functions on a chip used with an IC of FIG. 2.

Please refer to FIG. 7 and FIG. 8, which show respectively an embodiment of an apparatus for dynamic deployment of pin functions on a chip used with an IC of FIG. 1 and an embodiment of an apparatus for dynamic deployment of pin functions on a chip used with an IC of FIG. 2. In the embodiment where the IC is packaged with 10 pins, the output pin control unit 5 outputs to the old second pin 12 and the old tenth pin 20. A signal control unit 7 is control by a program so as to communicate the input pin receiving unit 4 and the output pin control unit 5 using the input signal 41, the input selection control signal 71, the output selection control signal 72 and the output signal 73. If the IC (packaged with 8 pins) of FIG. 2 is used, the user can use the program to invalidate the old tenth pin 20 and designate the new first pin 21 to take over the function provided by the old tenth pin 20.

Figure 9:
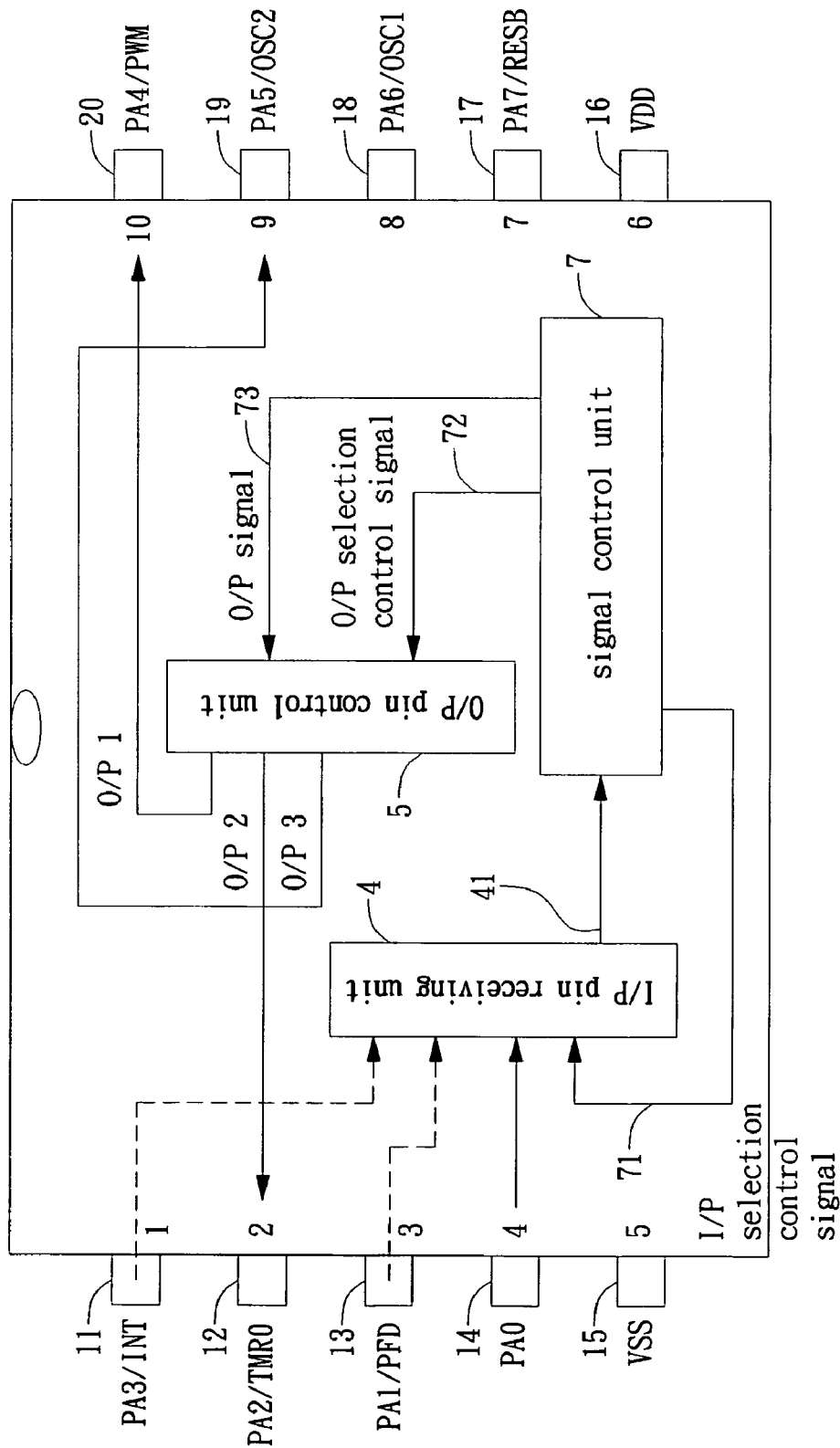
FIG. 9 shows another embodiment of an apparatus for dynamic deployment of pin functions on a chip used with an IC of FIG. 1.
Figure 10:
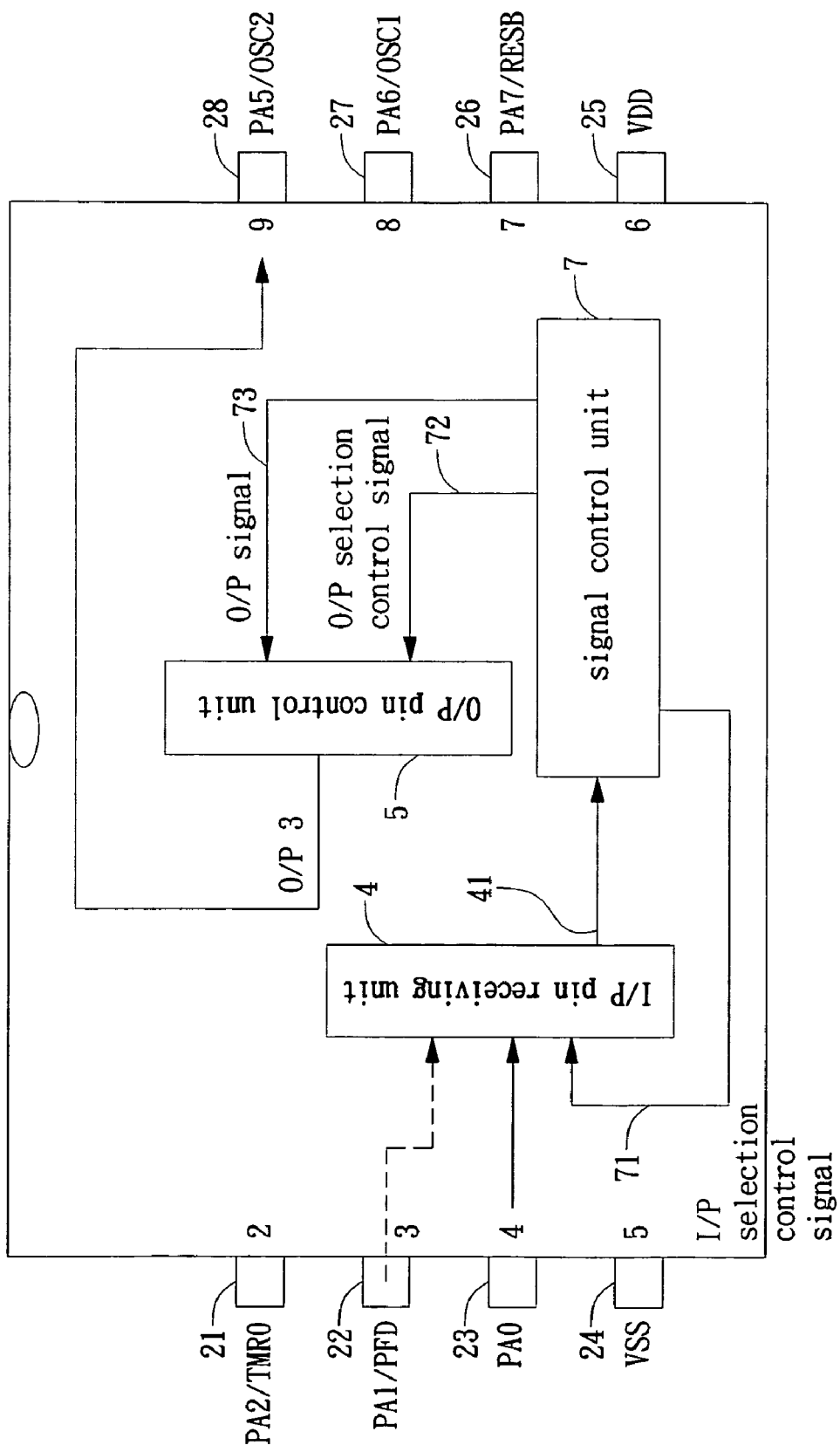
FIG. 10 shows another embodiment of an apparatus for dynamic deployment of pin functions on a chip used with an IC of FIG. 2.

Please refer to FIG. 9 and FIG. 10, which show respectively another embodiment of an apparatus for dynamic deployment of pin functions on a chip used with an IC of FIG. 1 and another embodiment of an apparatus for dynamic deployment of pin functions on a chip used with an IC of FIG. 2. The present invention is not limited neither to an IC packaged with different pins with the same function or to an IC packaged with different pins with different functions. In FIG. 9, where the IC is packaged with 10 pins, the input pin receiving unit 4 receives the old first pin 11, the old third pin 13 and the old fourth pin 14, and the output pin control unit 5 outputs to the old second pin 12, the old ninth pin 19 and the old tenth pin 20. A signal control unit 7 is control by a program so as to communicate the input pin receiving unit 4 and the output pin control unit 5 using the input signal 41, the input selection control signal 71, the output selection control signal 72 and the output signal 73. Referring to FIG. 10, if the IC (packaged with 8 pins) of FIG. 2 is used, the user can use the program to invalidate the old first pin 11 and designate the new third pin 22 or the new fourth pin 23 to take over the function provided by the old first pin 11 and invalidate the old tenth pin 20 and designate the new ninth pin 28 or the new second pin 21 to take over the function provided by the old tenth pin 20.

In the present invention, the pins are deployed with functions according to practical applications. Therefore, the present invention is characterized in function transfer of the pins instead of the pin functions. Moreover, the present invention is applicable to both the IC packaged with plugged-in lead structure and the IC packaged with surface-mounted (SMD) pad structure to achieve dynamic deployment of pin functions. The present invention is exemplified by a one-on-one arrangement of pins and pad. However, the present is not limited thereto. Moreover, the number of the multiplexers and the number of the control gates are not limited to the embodiments of the present invention.

From FIG. 1 to FIG. 10, it is understood that the present invention provides a general IC design concept emphasizing the flexibility in program design and the diversity in hardware selectivity. Therefore, the user can make the best deployment according to the practical uses and such a general IC design concept is widely applicable. Moreover, in the present invention, the user can appoint functions to selected pins when a chip is to be re-packaged or the number of pins is to be changed. Unlike conventional methods wherein wire bonding is used to change the pin functions, the apparatus for dynamic deployment of pin functions in the present invention integrate selected pins to deploy the pins for input and the pins for output according to the user using a program. Therefore, the present invention has been examined to be new, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An apparatus for dynamic deployment of pin functions on a chip, the apparatus comprising:
   an input pin receiving unit, capable of integrating a plurality of pins and selecting pin functions according to a program;
   an output pin control unit, capable of issuing a control signal to the plurality of pins; and
   a signal control unit, controlled by the program and coupled to the input pin receiving unit and the output pin control unit so as to communicate therebetween;
   wherein the pin functions are designated by the user to select an output signal for each of the plurality of pins according to the program;
   wherein the input pin receiving unit comprises a plurality of multiplexers; and
   wherein the number of the multiplexers equals to half of the number of the pins plus one.

2. The apparatus for dynamic deployment of pin functions on a chip as recited in claim 1, wherein the pins comprise a lead structure or a pad structure.

3. The apparatus for dynamic deployment of pin functions on a chip as recited in claim 1, wherein the output pin control unit comprises at least a control gate.

4. The apparatus for dynamic deployment of pin functions on a chip as recited in claim 1, wherein the program is software.

5. The apparatus for dynamic deployment of pin functions on a chip as recited in claim 1, wherein the program is a firmware.

6. The apparatus for dynamic deployment of pin functions on a chip as recited in claim 1, wherein the pins have the same function.

7. The apparatus for dynamic deployment of pin functions on a chip as recited in claim 1, wherein the pins have different functions.

\* \* \* \* \*